United States Patent [19]
Kizler et al.

[11] 3,935,538
[45] Jan. 27, 1976

[54] DIGITAL FREQUENCY-CONTROL CIRCUIT

[75] Inventors: Harald Kizler, Stuttgart; Bernd Przybyla; Peter-Jürgen Schmidt, both of Schwieberdingen, all of Germany

[73] Assignee: Robert Bosch G.m.b.H., Stuttgart, Germany

[22] Filed: Aug. 21, 1974

[21] Appl. No.: 499,337

[30] Foreign Application Priority Data
Sept. 22, 1973 Germany............................ 2347839

[52] U.S. Cl................ 328/38; 307/233 R; 307/295; 328/74
[51] Int. Cl.[2] ......................................... H03K 5/00
[58] Field of Search ............ 328/155, 133, 134, 38, 328/74, 42, 44, 48; 307/233 R, 295; 331/1 A

[56] References Cited
UNITED STATES PATENTS
3,633,105  4/1972  Lender et al. ...................... 328/155
3,781,695  12/1973  Jackson ............................. 328/44 X Primary Examiner—Siegfried H. Grimm
Attorney, Agent, or Firm—William R. Woodward

[57] ABSTRACT

Clock pulses are multiplied by a ratio less than 1 of which the numerator is controlled by a reversible counter. The multiplier output pulses initiate new countdown cycles of a second counter beginning with the clock pulse following the onset of an input frequency pulse and ending with the clock pulse following the onset of the next input frequency pulse. The state of the count at the end of the cycle determines whether the reversible counter will be left unchanged, advanced, or counted back and hence, whether the multiplier output frequency will be left unchanged, increased or reduced. The initial countdown value of the second counter is provided by a long term store which determines the frequency multiplication ratio. The circuit is usable to multiply a variable input frequency in a vehicle brake anti-lock system.

21 Claims, 6 Drawing Figures

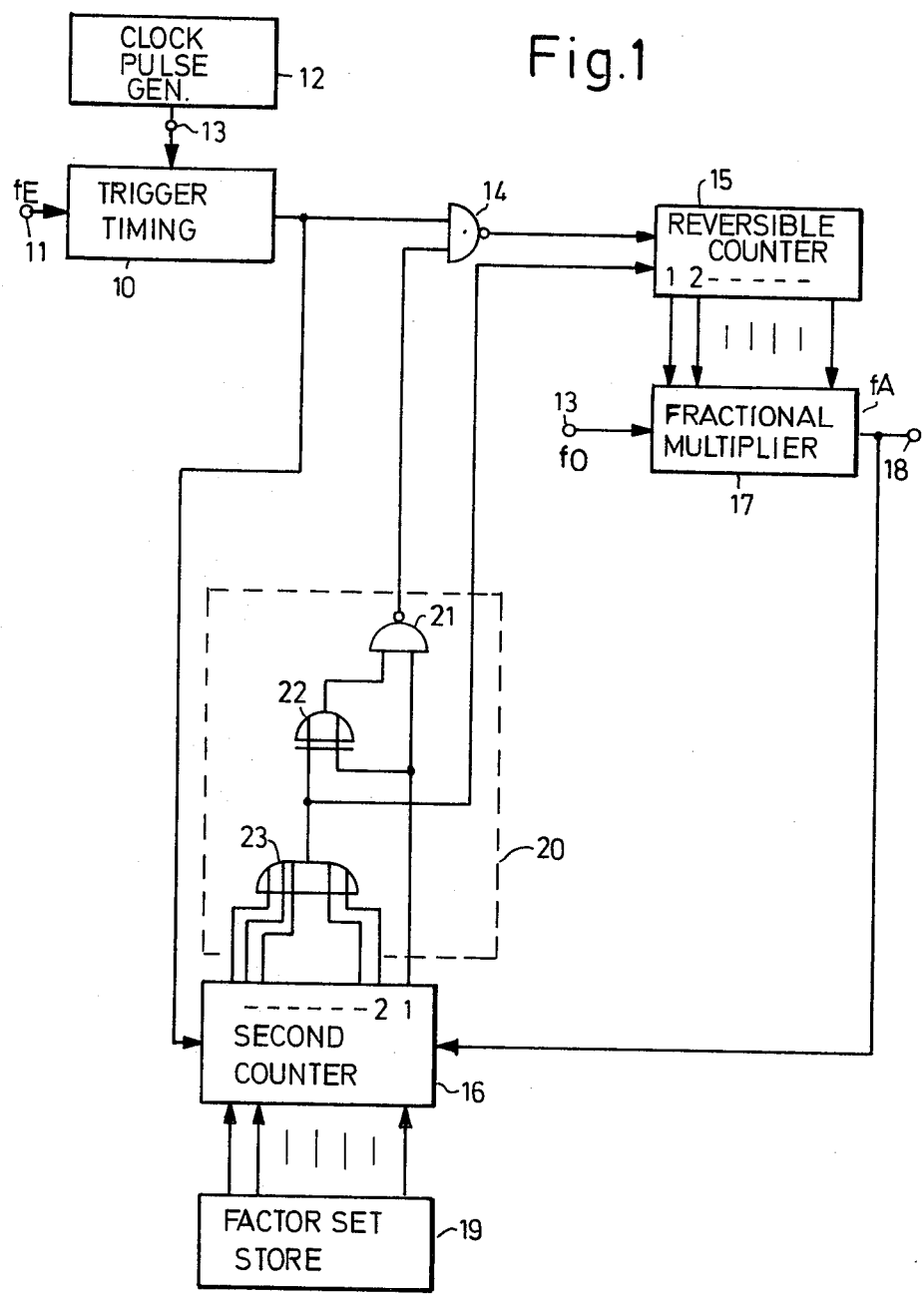

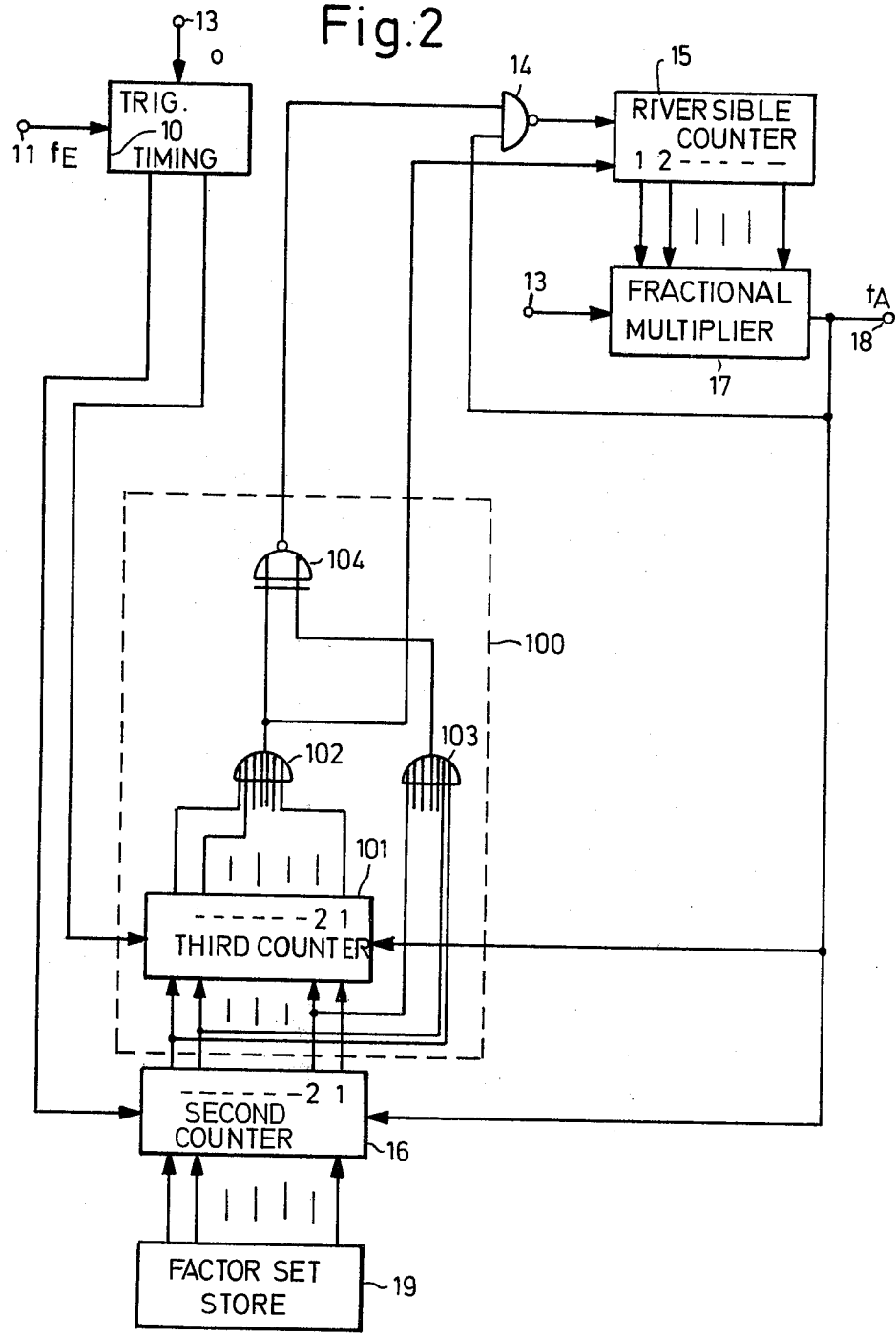

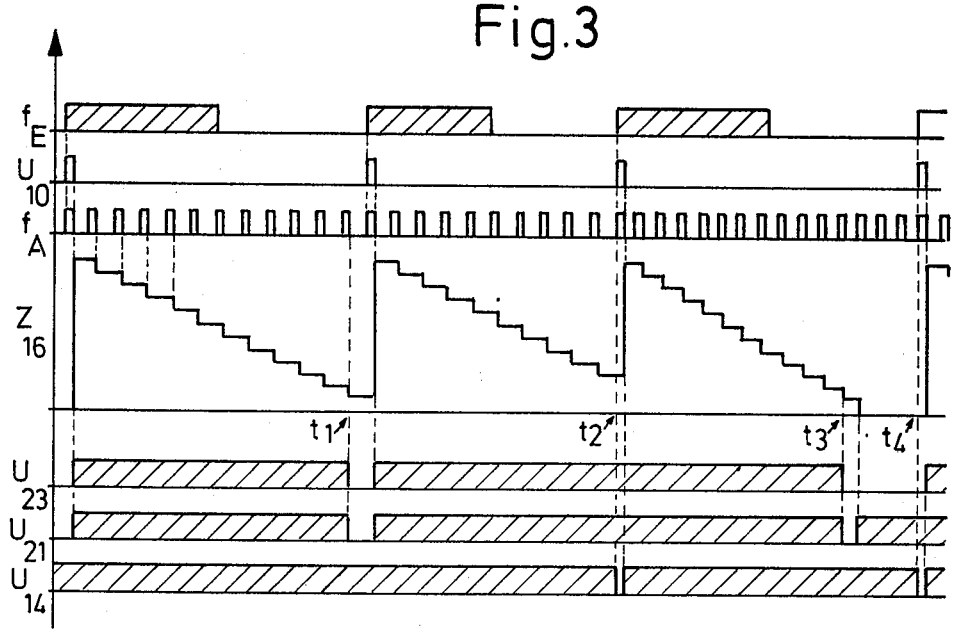
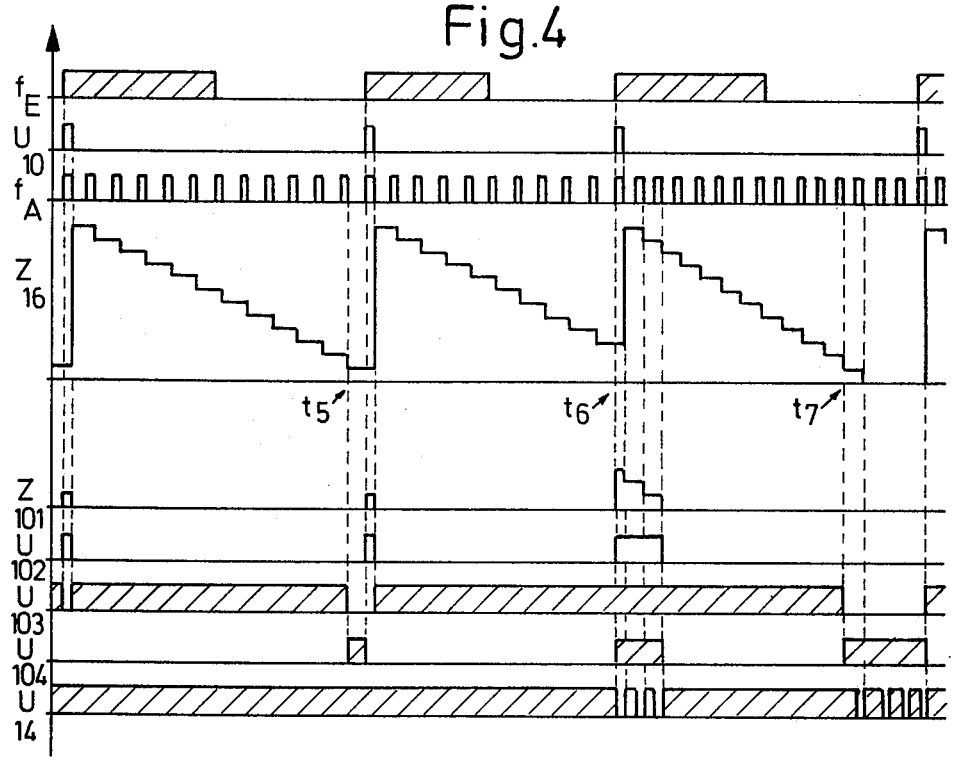

DIGITAL FREQUENCY-CONTROL CIRCUIT

This invention relates to a frequency comparison control circuit particularly for use for frequency multiplication of an input frequency, such a circuit being composed, as is known, of a source of electrical waves or pulses of a control led frequency, a frequency division stage and a phase comparison stage.

The purposes for which frequency comparison control circuits are used include, among others, operation as a coil-less filter, FM demodulation, frequency division and stereo decoding. The use of a frequency comparison control circuit for frequency multiplication is of particular interest for anti-locking systems for motor vehicle brakes. In such systems, tachogenerators connected to the wheels of the vehicle generate pulses of a frequency which must be multiplied to a higher frequency in order to enable an evaluation circuit to operate with a sufficiently small filter time constant. The evaluation circuit is preferably constituted to operate on a digital basis rather than on an analog basis.

Known frequency comparison control circuits operating on an analog basis contain an oscillator of a controlled frequency which can be reduced or increased by means of a control voltage dependent upon an output frequency adjustment. A following frequency reduction stage provides a frequency division ratio between the controlled oscillator frequency at its input and its low-frequency output. An input frequency to the system is compared in a comparison stage with the output signal of the frequency divider stage, so that the controlled oscillator frequency may be locked into a multiple of the input frequency. When the compared signals coincide, the oscillator frequency remains unchanged and the control loop is balanced. When the compared signals tend to shift out of balance, the output of the comparison stage corrects the oscillator frequency to keep it in step. The disadvantage of the known analog comparison control circuits is principally that unless special measures are taken, the fedback signal can be locked into a harmonic of the input signal. This disadvantage can be mitigated by an additional coarse control or pre-control, but such provisions give rise to a large additional circuit cost.

It is an object of the present invention to provide a comparison type frequency control circuit operating on a digital basis in which lock-in problems of the type just mentioned do not arise, so that an output frequency having an unambiguous fixed relation to an input frequency can be produced with great reliability.

SUBJECT MATTER OF THE PRESENNT INVENTION

Briefly, a reversible digital counter controlling a digital multiplier stage is used as the generator of pulses of controlled frequency, the output of this multiplier stage is used to control the loading of the stored number into a second counter used as a frequency divider stage, and the comparison stage of the system operates to modify the stored count number of the reversible counter in accordance with the count content of the second counter upon the arrival of a new input signal.

In a particular form of the invention, a decoder stage is provided having a gate circuit operating as the phase comparison circuit, the output of this gate circuit being connected to the counting input of the reversible counter. The gate circuit provides at least one count signal for changing the count condition of the reversible counter whenever at the beginning of a new input signal the counting cycle of the second counter is either not yet complete or has previously been completed (i.e. but not necessarily when the predetermined completion stage is reached in synchronism with the beginning of a new input signal).

The advantages obtained with the control system of the present invention is that no more lock-in ambiguities can arise, i.e. the output signal cannot lock on a harmonic of the input signal. Further more, a basically simple and highly economic production of the control circuit can be obtained by the use of integrated circuits. In the form of the system utilizing three-condition control, there is no lag in the synchronized condition.

The invention is further described by way of two illustrative examples with reference to the accompanying drawings, in which:

FIG. 1 is a schematic circuit diagram of a digital frequency control circuit utilizing constant regulating step size at the time of any input pulse;

FIG. 2 is a diagram of another form of digital frequency control circuit utilizing variable regulating step size at the time of any input pulse;

FIG. 3 is a timing diagram for explaining the operation of the circuit of FIG. 1;

FIG. 4 is a timing diagram for explaining the operation of the circuit of FIG. 2;

Figure 5:
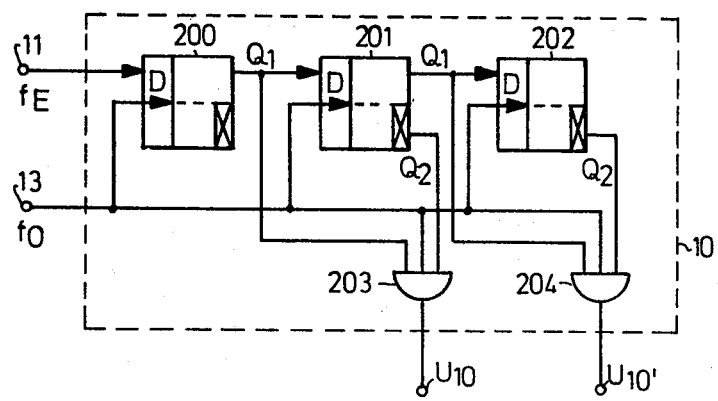
FIG. 5 is a diagram of an example of an initial processing stage for the input signal in FIG. 1 and FIG. 2.

In the example of a digital frequency control circuit shown in FIG. 1, pulses of the input frequency $f_E$ supplied to a terminal 11 are first subjected to an initial processing stage 10, which is also supplied with pulses of a base frequency or clock frequency $f_0$. The output of the initial processing stage 10 is a trigger pulse supplied to a NAND-gate 14 operating as an input gate for the counting input of a reversible counter 15. The output of the initial processing stage 10 is also supplied to the transfer input of a second counter 16 constituted as a count-down counter. The binary digit outputs of the reversible counter 15 are connected to the inputs of a digital multiplier stage 17, that may be constituted either as a serial multiplier or as a parallel multiplier. Digital multipliers utilize repeated operations of addition and those using a serial adder are known as serial multipliers and those using a parallel adder are known as parallel multipliers. For example a serial multiplier is commercially available under the designation SN 7479. If uniform output signals are desired, a parallel multiplier can be used, these being likewise commercially available.

The multiplier stage 17, like the initial processing stage 10, is supplied with pulses of the clock frequency $f_0$. Pulses of the multiplier output frequency $f_A$ are supplied both to an output terminal 18 and to the counting input of the second counter 16. A storage stage 19, which may for example be of the type known as a read-only memory, furnishes its output to the write-in inputs of the second counter 16.

In the simplest case, the storage stage 19 can be provided in hard wired form simply applying to each digit write-in input the 0-signal or 1-signal required to write the binary number required on a permanent basis by the counter 16. The expressions 0-signal and 1-signal designate the two usual alternative signals of digital circuitry, a 0-signal generally representing a potential roughly corresponding to ground potential.

The outputs of the second counter 16 are connected to a decoder stage 20, in which the units digit (in binary digits, this is the $2^0$ digit) output is connected both to the input of a second NAND-gate 21 and to the input of an EXCLUSIVE OR (antiparity) gate 22. The remaining outputs of the second counter 16 are connected to the input of an OR-gate 23, the output of which is connected both to the second input of the EXCLUSIVE OR gate 22 and to the directional control input of the reversible counter 15. The output of the EXCLUSIVE OR gate 22 is connected to the second input of the second NAND-gate 21, the output of which is connected to the second input of a first NAND-gate 14 constituting the entry gate for the counting input of the counter 15.

Operation of Circuit of FIG. 1 by Reference to Timing Diagram of FIG. 3. The top line of FIG. 3 shows pulses of the input frequency $f_E$ which is processed by reference to pulses of the clock frequency $f_0$ in the initial processing stage 10, which may also be referred to as a trigger stage or as a timing stage, so as to produce the pulse sequency $u_{10}$ shown on the second line of FIG. 3, which appears at the output of the processing stage 10 of FIG. 1. In the following discussion, the steady state condition of the control circuit will be considered. When the circuit is in step, the NAND-gate 14 is blocked. A characteristic binary number is then stored in the reversible counter 15. The multiplier stage 17 multiplies the clock frequency $f_0$ with the ratio of the stored binary number to the largest binary number storable in the reversible counter 15, and produces thereby pulses of the output frequency $f_A$, shown on the third line of FIG. 3. It is evident that the frequency $f_A$ cannot be greater than the clock frequency $f_0$. Upon the arrival of the back edge of each trigger pulse $u_{10}$ produced by the processing stage 10, the fixed content of the store 19 is written into the second counter 16. At the moment of the trailing edge of each output pulse of frequency $f_A$ produced by the multiplier 17, the content $Z_{16}$ of the second counter 16 is counted downwards, as shown plotted above the fourth horizontal line of FIG. 3.

If a three-condition loop control is desired, then if at the beginning of a new trigger signal $U_{10}$ the content of the counter 16 is 1, the NAND-gate 14 controlling the counter 15 is blocked, indicating the circuit is in step, the counter 15 is not changed and consequently the output frequency $f_A$ of the multiplier 17 is not altered. On the other hand, if the count of the second counter 16 at the beginning of a new trigger signal is greater or smaller than 1, the gate 14 opens and the content of the counter 15 is increased or reduced in accordance with the direction of count unbalance, so that the multiplier output frequency $f_A$ is increased or reduced.

As shown in FIG. 3, at the moment $t_1$ the count in the second counter 16 has fallen to the value 1, as the result of which a 0-signal appears at the output of the OR-gate 23. Since at the units digit output of the counter 16 a 1-signal is still present, a 0-signal is produced at the output of NAND-gate 21. The trigger pulse at the output of the processing stage 10 at this moment can therefore not influence the output of NAND-gate 14. When the trailing edge of this trigger pulse arrives, the content of the store 19 is written into the second counter 16 and 1-signals again appear at the outputs of the gates 21 and 23. The next part of FIG. 3 shows the case of an increase of the input frequency $f_E$. In this case, the content of the counter 16 at the beginning of a new trigger pulse at the moment $t_2$ has not yet been counted down to the number 1. Accordingly, 1-signals appear at the outputs of the gates 23 and 21 and the trigger pulse $U_{10}$ an 0-signal at the output of NAND-gate 14, which is the condition that causes the count of the reversible counter 15 to change. The counter 15, accordingly, changes its content by the value 1. The 1-signal appearing at the output of the OR-gate 23 is supplied at the same time to the directional control input of the counter 15 and causes the effect of the momentary 0 at the output of gate 14 to have a positive rather than a negative effect, so that the content of the counter 15 is increased, as is also the multiplier output frequency $f_A$.

In the third input frequency period shown at the right of FIG. 3, the case of a decrease of the input frequency $f_E$ is illustrated. At the moment $t_3$ at which the content of the counter 16 has been reduced to the value 1, 0-signals appear at the outputs of the gates 23 and 21 as was the case at the moment $t_1$. On the next multiplier output pulse, the content of the counter 16 reaches the value 0. A 1-signal reappears then, at the output of NAND-gate 21. When the next trigger pulse $U_{10}$ arrives at the moment $t_4$, a 0-signal is accordingly produced at the counting input of the reversible counter 15, this beging as before the condition which changes the content of the counter. In this case, the content is reduced, because a 0-signal is present at the output of OR-gate 23 and hence at the directional control input of the counter 15. The multiplier output frequency $f_A$ is accordingly reduced. If a two-condition control of the synchronization instead of the three-condition control above described is desired, that can be provided by simply connecting the units output of the counter 16 additionally with another input of OR-gate 23.

The second illustrative embodiment of a phase-locked loop circuit which is shown in FIG. 2 corresponds in large measure to the circuit of FIG. 1. One significant modification of the circuit of FIG. 1 provided in FIG. 2 is that the input of NAND-gate 14 is connected to the terminal 18 rather than to the output of processing stage 10. A further difference is that instead of the decoder stage 20, a different decoder stage 100 is provided which consists of a third counter 101 constituted as a count-down counter together with two OR-gates 102 and 103 and an EXCLUSIVE NOR gate 104 (parity gate). The loading control connection of the third counter 101 is in the case connected with the trigger output of the processing stage 10 and the count advance input of this counter is connected to the terminal 18. The count outputs of the second counter 16 are connected with the write-in inputs of the third counter 101. All outputs of the third counter 101 are connected to inputs of OR-gate 102 and all outputs except the units output of the second counter 16 are connected to inputs of OR-gate 103. The outputs of the two OR-gates 102 and 103 are connected to the two inputs of the parity gate 104, the output of which is connected to one input of NAND-gate 14.

FIG. 4 illustrates the operation of the circuit of FIG. 2 in the same manner that FIG. 3 illustrates the operation of the circuit of FIG. 1. The important difference between these two circuits is that the correction of a deviation of the multiplier output frequency $f_A$ from the value required for balance as detected in the comparison stage 100 varies in magnitude with the extent of the detected deviation, so that if the deviation is more than the minimum detectable deviation, two or more pulses can be provided at the end of an input frequency period to the reversible counter 15.

At the beginning of the trigger pulse $U_{10}$ that appears at the moment $t_5$, the count in the second counter 16 has been reduced to the value 1. The effect of this trigger pulse, which is applied to the loading input of the third counter 101, is to write the content of the second counter 16 into the third counter 101. A 1-signal accordingly appears at the output of OR-gate 102. At the same time a 0-signal is present at the output of OR-gate 103, because the units digit output of the second counter 16 is not connected to an input of OR-gate 103. A 0-signal accordingly appears at the output of the parity gate 104, which is to say, at the output of the decoder stage 100. In consequence, no pulse of frequency $f_A$ can reach the reversible counter 15 through NAND-gate 14. The frequency $f_A$, accordingly, does not change.

At the moment $t_6$, a trigger pulse $U_{10}$ arrives after the input frequency $f_E$ has increased, so that the content of the second counter 16 at this moment has been reduced only to a value that is greater than 1. This value is transferred to the third counter 101 by command of the trigger pulse and is subsequently counted down to 0 at the end of successive pulses of frequency $f_A$. During the time taken by the count-down in the third counter 101, a 1-signal is present at the output of OR-gate 102. A 1-signal is likewise present at this time at the output of OR-gate 103, because the content of the second counter 16 has not reached the value 1. The output of the parity gate 104 will accordingly produce a 1-signal during the countdown by the third counter 101, keeping NAND-gate 14 operable during this period so that successive short periods of 0-signal will be produced in synchronism with pulses of frequency $f_A$ during this time, thereby changing the content of reversible counter 15. The sense of this change is made positive by the 1-signal appearing at the output of OR-gate 102 are applied to the directional control input of the counter 15.

As shown in FIG. 4, the input frequency then changes to a smaller value, so that the counting cycle of the second counter 16 is completed before a new trigger signal arrives. The third counter 101 can, accordingly, not receive any content and an 0-signal persists at the output of OR-gate 102. Beginning with the moment $t_7$, when the second counter 16 has reached the value 1, and continuing till the trailing edge of the next trigger signal arrives, a 0-signal appears at the output of OR-gate 103. For the period during which 0-signals are present at both OR-gates 102 and 103, a 1-signal is present at the output of parity gate 104, which allows pulses of 0-signal to appear at the output of NAND-gate 14 in synchronism with pulses of frequency $f_A$, thereby to change the content of reversible counter 15. The direction of counting is made negative by the 0-signal at the output of OR-gate 102.

The set ratio between the output frequency $f_A$ and the input frequency $f_E$ can be changed by changing the number stored in the store 19.

If two-condition regulation is desired for the circuit of FIG. 2 instead of the three-condition operation described, all that needs to be done is to connect the units digit output of the second counter 16 additionally to an additional input of OR-gate 103.

The circuit shown in FIG. 5 represents an illustrative example of the processing stage 10 that produces trigger signals. Three D-flipflop circuits 200, 201 and 202 are provided, each having a synchronizing input connected to the terminal 13 where clock pulses of the frequency $f_0$ are provided. At the present input D of the first flipflop 200, the input frequency $f_E$ present at the terminal 11 is supplied. The output $Q_1$ of the first flipflop 200 is connected both with the present input D of the second flipflop 201 and with one input of an AND-gate 203. The output $Q_1$ of the second flipflop 201 is connected both with the preset input D of the third flipflop 202 and with one input of a second AND-gate 204. The inverted output $Q_2$ of the second flipflop 201 is connected with another input of the first AND-gate 203. The output $Q_2$ of the third flipflop 202 is connected to another input of the second AND-gate 204. Finally, the terminal 13 is connected to a third input of each of the AND-gates 203 and 204.

Figure 6:
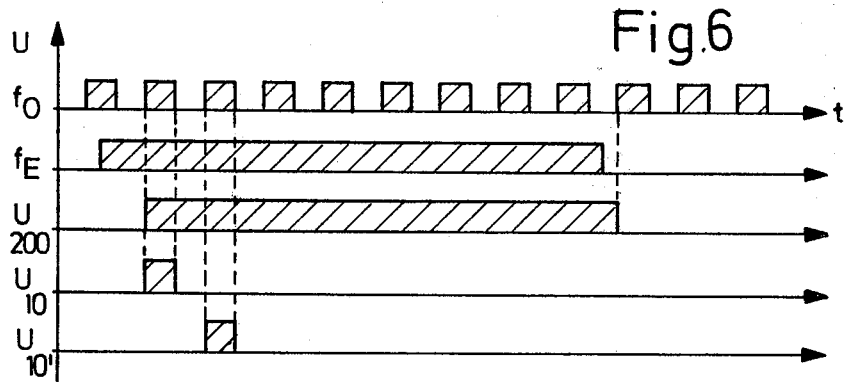
FIG. 6 is a timing diagram for explaining the operation of the initial processing stage of FIG. 4.

FIG. 6 illustrates the operation of the circuit of FIG. 5 by way of a timing diagram. When an input signal of frequency $f_E$ arrives, there is produced, preferably at the moment of the leading edge of the next clock pulse of frequency $f_0$, a 1-signal at the output $Q_1$ of the first flipflop 200. This 1-signal persists until the condition is fulfilled that at the beginning of a new clock pulse no input signal remains. The 1-signal thus present at the $Q_1$ output of the first flipflop 200 is transfered by the next clock pulse to the $Q_1$ output of the second flipflop 201 and further by the next following clock pulse to the $Q_1$ output of the third flipflop 202. The transfer of the 1-signal from the preset input to the $Q_1$ output of a flipflop in each case changes the inverted $Q_2$ output from a 1-signal to a 0-signal. In this way the 1-signals $U_{10}$ and $U_{10}$, appear respectively at the AND gates 203 and 204 offset in time by one clock pulse.

In the circuit shown in FIG. 2 the leading edge of the trigger signal $U_{10}$ is used to transfer the content of the second counter 16 to the third counter 101. The trailing edge of this trigger signal is utilized to write the content of the store 19 into the second counter 16. Instead of using the leading and trailing edges of a single clock pulse for these respective operations, the two leading edges, or, if preferred, the two trailing edges, or two successive signals such as are produced by the circuit of FIG. 5 can be utilized for initiating the respective operations.

Although the invention has been described with respect to certain illustrative embodiments, it will be understood that variations and modifications are possible within the inventor's concept.

We claim:
1. A digital frequency control circuit comprising:
a reversible counter;
a digital multiplying stage arranged for control of one of its factors by said reversible counter, said multiplying stage (17) serving as a controlled variable frequency generator of said frequency control circuit;
a frequency divider stage comprising a second counter (16) and a storage circuit, the content of which determines its frequency division factor, said content being arranged to be counted out repeatedly at the output frequency of said multiplier stage (17); and means for determining the content of said second counter (16) at the beginning of a new input signal ($f_E$) and for correctively changing the stored content of said reversible counter (15) in response thereto, said last-mentioned means serving as comparison means for the frequency control circuit.

2. A digital frequency control circuit as defined in claim 1 which comprises also a source of clock pulses supplying pulses to said multiplying stage and synchronizing means (10) for synchronizing trigger pulses of said input frequency ($f_E$) with the pulses provided by said source of clock pulses.

3. A digital frequency control circuit as defined in claim 2 which comprises also storage means for storing a fixed digital number and means for transferring said digital number repeatedly from said storage means (19) to said second counter (16) in response to successive trigger pulses ($U_{10}$) derived from said input frequency ($f_E$).

4. A digital frequency control circuit as defined in claim 3 in which said trigger pulses ($U_{10}$) are derived from pulses of said input frequency by said synchronizing means.

5. A digital frequency control circuit as defined in claim 2 in which said means serving as comparison means for said control circuit comprises decoding means (20,100) and a gate circuit (14) responsive thereto, in which, further, the output of said gate circuit (14) is connected to an input of said reversible counter (15) and said gate circuit and decoder circuit are so constituted that at least one count signal ($U_{14}$) is produced for altering the content of said reversible counter (15) in the appropriate direction when at the beginning of a new signal of input frequency ($f_E$) the counting cycle of said second counter (16) is short of terminating and likewise when said counting cycle is past termination.

6. A digital frequency control circuit as defined in claim 5 in which said second counter (16) is a countdown counter.

7. A digital frequency control circuit as defined in claim 6 in which the output of said synchronizing means (10) is connected to an input of said gate circuit (14).

8. A digital frequency control circuit as defined in claim 7 in which the outputs of said second counter (16) are connected with logic gates (21 to 23) contained in said decoding means (20) in such a way that said gate circuit (14) is blocked in the presence of signals ($U_{10}$) produced by said synchronizing means (10), whenever at the beginning of a new signal of input frequency ($f_E$) the counting cycle of said second counter (16) is completed by the content of said second counter (16) being counted down to a predetermined number.

9. A digital frequency control circuit as defined in claim 8 in which said predetermined number has the value 1.

10. A digital frequency control circuit as defined in claim 8 in which said predetermined number has the value 0.

11. A digital frequency control circuit as defined in claim 6 in which said decoding means (100) comprises a third counter (101) and in which means are provided for transferring the content of said second counter (16) to said third counter (101) at the beginning of a new signal of input frequency ($f_E$).

12. A digital frequency control circuit as defined in claim 11 in which said third counter (101) is a countdown counter.

13. A digital frequency control circuit as defined in claim 11 in which the output of said multiplier stage (17) is supplied to the counting input of said third counter (101).

14. A digital frequency control circuit as defined in claim 13 in which said decoding means (100) is provided with logic gates (102 to 104) arranged to control said gate circuit (14) in such a manner that the latter passes counting signals whenever at the beginning of a new signal of input frequency ($f_E$), the content of said third counter (101) is a predetermined number.

15. A digital frequency control circuit as defined in claim 14 in which said predetermined number related to said third counter (101) is greater than 0.

16. A digital frequency control circuit as defined in claim 15 in which said predetermined number related to said third counter (101) is greater than 1.

17. A digital frequency control circuit as defined in claim 14 in which the period during which said gate circuit (14) passes counting signals is equal to the duration of the count of said third counter (101).

18. A digital frequency control circuit as defined in claim 12 in which said decoding means (100) is provided with logic gates (102 to 104) arranged to control said gate circuit (14) in such a manner that said gate circuit (14) passes counting signals whenever the counting cycle of said second counter (16) has been completed before a new signal of input frequency ($f_E$) arrives.

19. A digital frequency control circuit as defined in claim 12 in which the output of said multiplier stage (17) is connected to one input of said gate circuit (14).

20. A digital frequency control circuit as defined in claim 5 in which said decoding means (20,100) is provided with a logic gate (23,102), the output of which is connected to the direction determining input of said reversible counter (15), whereby the direction of counting for incoming counting signals of said reversible counter (15) is controllable in response to the content of said second counter (16).

21. A digital frequency control circuit as defined in claim 11 in which said decoding means (20,100) is provided with a logic gate (23, 102), the output of which is connected to the direction controlling input of said reversible counter (15) in such a way as to control the direction of response of said reversible counter (15) to incoming count signals in accordance with the content of said third counter (101).

* * * * *